(12) United States Patent
Lee et al.

(10) Patent No.: US 10,319,294 B2
(45) Date of Patent: Jun. 11, 2019

(54) ORGANIC LIGHT EMITTING DIODE DISPLAY CAPABLE OF COMPENSATING A RIPPLE VOLTAGE

(71) Applicant: Samsung Display Co., Ltd., Yongin-si, Gyeonggi-do (KR)

(72) Inventors: Jae Hoon Lee, Yongin-si (KR); Young In Hwang, Yongin-si (KR)

(73) Assignee: Samsung Display Co., Ltd. (KR)

( * ) Notice: Subject to any disclaimer, the term of this patent is extended or adjusted under 35 U.S.C. 154(b) by 472 days.

(21) Appl. No.: 15/073,378

(22) Filed: Mar. 17, 2016

(65) Prior Publication Data

US 2017/0047008 A1 Feb. 16, 2017

(30) Foreign Application Priority Data

Aug. 13, 2015 (KR) .................. 10-2015-0114827

(51) Int. Cl.
G09G 3/32 (2016.01)
G09G 3/3233 (2016.01)
H01L 27/12 (2006.01)

(52) U.S. Cl.
CPC ..... *G09G 3/3233* (2013.01); *G09G 2300/0809* (2013.01); *G09G 2300/0819* (2013.01); *G09G 2300/0852* (2013.01); *G09G 2310/0243* (2013.01); *G09G 2310/0245* (2013.01); *G09G 2310/0291* (2013.01); *G09G 2330/028* (2013.01); *H01L 27/124* (2013.01)

(58) Field of Classification Search
CPC ......... G09G 3/3233; G09G 2300/0809; G09G 2300/0819

USPC .......................................................... 345/82
See application file for complete search history.

(56) References Cited

U.S. PATENT DOCUMENTS

| | | | |
|---|---|---|---|
| 2003/0030381 A1* | 2/2003 | Yamazaki | G02F 1/13454 315/169.1 |
| 2012/0062613 A1 | 3/2012 | Park et al. | |
| 2013/0026503 A1* | 1/2013 | Son | H01L 51/5243 257/88 |
| 2013/0057533 A1* | 3/2013 | Baek | H04N 5/70 345/211 |
| 2013/0249883 A1* | 9/2013 | Hwang | G09G 3/003 345/212 |
| 2014/0022227 A1* | 1/2014 | Kim | G06F 3/038 345/212 |

(Continued)

FOREIGN PATENT DOCUMENTS

| KR | 10-2012-0028426 A | 3/2012 |
|---|---|---|
| KR | 10-2014-0071727 A | 6/2014 |
| KR | 10-2015-0022457 A | 3/2015 |

*Primary Examiner* — Jonathan M Blancha
(74) *Attorney, Agent, or Firm* — Innovation Counsel LLP

(57) ABSTRACT

An organic light emitting diode (OLED) display of the present inventive concept includes: pixels connected to scan lines, data lines, and control lines; a data driver for supplying a data signal to the pixels via the data lines; a scan driver for supplying a scan signal to the pixels via the scan lines; and a control driver for supplying a first control signal to the pixels via the control lines. The control driver feeds back the first control signal supplied to the pixels so as to compensate a ripple voltage included in the first control signal, and generates a compensated first control signal by using the fed-back first control signal.

14 Claims, 4 Drawing Sheets

(56) References Cited

U.S. PATENT DOCUMENTS

| | | | |
|---|---|---|---|
| 2014/0139505 A1* | 5/2014 | Han | G09G 3/003 345/212 |
| 2014/0176839 A1* | 6/2014 | Oh | G09G 3/3655 349/33 |
| 2015/0054809 A1 | 2/2015 | Lim et al. | |
| 2015/0062471 A1* | 3/2015 | Sung | G09G 3/3655 349/33 |

* cited by examiner

ORGANIC LIGHT EMITTING DIODE DISPLAY CAPABLE OF COMPENSATING A RIPPLE VOLTAGE

CROSS-REFERENCE TO RELATED APPLICATION

This application claims priority to and the benefit of Korean Patent Application No. 10-2015-0114827, filed on Aug. 13, 2015, in the Korean Intellectual Property Office, the entire contents of which are incorporated herein by reference in their entirety.

BACKGROUND

1. Field

Exemplary embodiments according to the concept of the present inventive concept relates to an organic light emitting diode (OLED) display, and particularly to an OLED display for supplying a first control signal in which a ripple voltage is compensated by feeding back a first control signal applied to a pixel.

2. Description of the Related Art

Among flat panel displays, an organic light emitting diode (OLED) display displays an image by using an OLED that emits light when electrons and holes are recombined. The OLED display has merits in that it has a fast response speed and is driven with low power.

The OLED display includes a plurality of pixels that are connected to a plurality of data lines, scan lines, power lines, and the like. The pixels typically include an OLED, at least two transistors including a driving transistor, and at least one capacitor.

In this case, each of the pixels may store a voltage corresponding to a difference between a control signal and a data signal supplied via the data line in the capacitor, and may emit light with luminance corresponding to a difference between the stored voltage and a power supply voltage supplied via the power line.

However, since a ripple voltage is generated in the control signal when the data signal is supplied to each of the pixels, the capacitor may not be able to stably store the data signal.

SUMMARY INVENTIVE CONCEPT

The present inventive concept has been made in an effort to provide an organic light emitting diode (OLED) display that can supply, to compensate a ripple voltage generated in a control signal when a data signal is supplied to each of pixels, a new control signal in which the ripple voltage is compensated by feeding back a control signal supplied to each of the pixels.

An OLED display according to an exemplary embodiment of the present inventive concept includes: pixels connected to scan lines, data lines, and control lines; a data driver for supplying a data signal to the pixels via the data lines; a scan driver for supplying a scan signal to the pixels via the scan lines; and a control driver for supplying a first control signal to the pixels via the control lines. The control driver feeds back the first control signal supplied to the pixels so as to compensate a ripple voltage included in the first control signal, and generates a compensated first control signal by using the fed-back first control signal.

In some exemplary embodiments, the pixels may be differently operated by dividing one frame period into a reset period, a compensation period, a data period, and an emitting period.

In some exemplary embodiments, the pixels may respectively receive and store a first data signal corresponding to the corresponding frame for one frame period, and may simultaneously emit light with luminance corresponding to a second data signal corresponding to a previous frame of the corresponding frame.

In some exemplary embodiments, the pixel may respectively store a voltage corresponding to a difference between the data signal and the first control signal, and may emit light with luminance corresponding to a difference between a stored voltage and a first power supply voltage.

In some exemplary embodiments, the control driver may feed back the first control signal supplied to each of the pixels during the data period, and may generate the compensated first control signal by using the fed-back first control signal.

In some exemplary embodiments, the control driver may supply the first control signal via some of the control lines, and may feedback the first control signal supplied to the pixels via the rest of the control lines.

In some exemplary embodiments, the control lines may be connected to each other, and the pixels may simultaneously receive the first control signal from the control driver.

The control driver may include: a timing selector configured to determine whether to generate the compensated first control signal or not; a sensing unit configured to feed back and sense the first control signal supplied to each of the pixels according to determination of the timing selector; an inverter unit configured to generate an inverted first control signal by inversely amplifying the sensed first control signal; and a first control signal generator configured to generate the compensated first control signal by reflecting the inverted first control signal to the first control signal supplied to the pixels.

In some exemplary embodiments, the timing selector may determine to generate the compensated first control signal during at least one of the rest of periods other than the compensation period.

In some exemplary embodiments, the timing selector may transmit timing information to the first control signal generator when the timing selector determines not to generate the compensated first control signal, and the first control signal generator may generate the first control signal according to the timing information and supplies it to each of the pixels.

In some exemplary embodiments, the inverter unit may invert a phase of the sensed first control signal, amplify the first control signal with a predetermined ratio, and generate the inverted first control signal.

In some exemplary embodiments, the first control signal generator may generate the compensated first control signal by increasing or decreasing a magnitude of the first control signal according to the inverted first control signal, and supplies the compensated first control signal to each of the pixels.

In some exemplary embodiments, the pixels may respectively include: a first transistor with a gate electrode connected to a first scan line of the scan lines, a first electrode connected to a first data line of the data lines, and a second electrode connected to a first node; a second transistor with a gate electrode connected to a second control line for supplying a second control signal, a first electrode connected to the first node, and a second electrode connected to a second node; a third transistor with a gate electrode connected to a third node, a first electrode connected to a first power supply voltage, and a second electrode connected to an anode of an OLED; a fourth transistor with a gate electrode connected to a first control line of the control lines, a first electrode connected to the anode, and a second electrode connected to the third node; a fifth transistor with a gate electrode connected to the first control line, a first electrode connected to the first data line, and a second electrode connected to the second node; a first capacitor connected between the first node and the first control line; a second capacitor connected between the first power voltage and the second node; and a third capacitor connected between the second node and the third node.

In some exemplary embodiments, the fourth transistor and the fifth transistor may continue to be turned on during the reset period and the compensation period.

In some exemplary embodiments, the second transistor may continue to be turned on during the data period.

In some exemplary embodiments, the first transistor may be turned on during the emitting period to apply the data signal to the first node.

In the OLED display according to the exemplary embodiment of the present inventive concept, the data signal of a desire magnitude may be stably stored in each pixel even if the ripple voltage is generated in the control signal supplied to the pixels.

Accordingly, each pixel of the OLED display can emit light with desired luminance, so luminance imbalance generated on a display area can be solved, thereby displaying an image of desired luminance.

BRIEF DESCRIPTION OF THE DRAWINGS

Example embodiments will now be described more fully hereinafter with reference to the accompanying drawings; however, they may be embodied in different forms and the inventive concept should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION OF THE EMBODIMENTS

Figure 1:
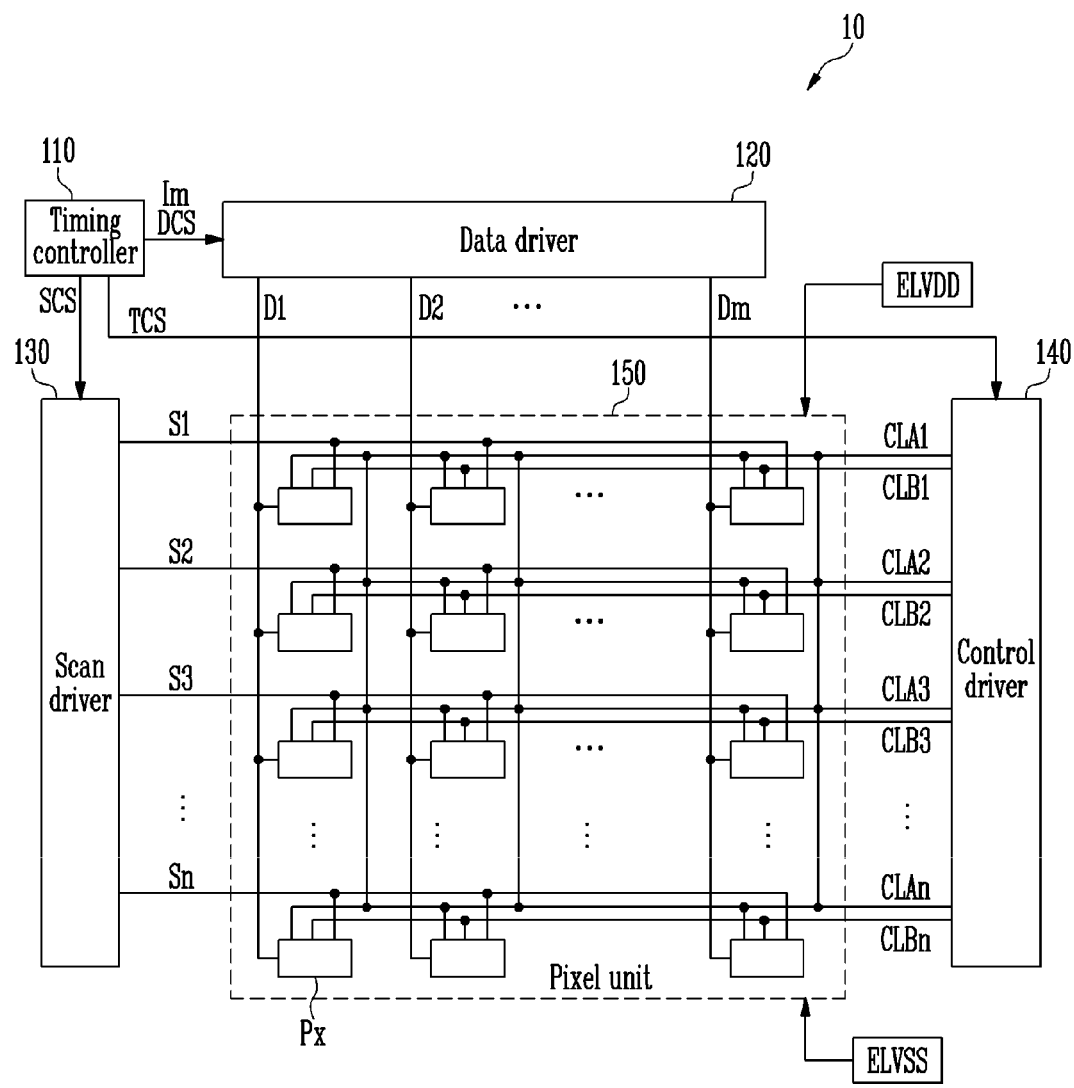
FIG. 1 is a schematic block diagram of an organic light emitting diode (OLED) display according to an exemplary embodiment of the present inventive concept.

A specific structural or functional description for exemplary embodiments according to the present inventive concept disclosed in the present specification is exemplarily made only to describe the exemplary embodiments according to the present inventive concepts, and the exemplary embodiments according to the present inventive concept may be practiced in various forms without being limited to the exemplary embodiments described in the present specification.

Since the exemplary embodiments according to the present inventive concept may have various modifications and various forms, the exemplary embodiments will be illustrated in the drawings and be fully described in the present specification. However, it is to be understood that the exemplary embodiments according to the concept of the present inventive concept are not limited the specific forms of disclosure but include all modifications, equivalents, and substitutions included in the spirit and scope of the present inventive concept.

The terms "first", "second", etc. may be used to describe various components, but the components should not be limited to the terms. The terms are used only to distinguish one component from another. For example, the first component may be called second component, and similarly, the second components may be called the first component, without departing from the spirit and scope of the appended claims according to the concept of the present inventive concept.

It is to be understood that when one component is referred to as being "connected" or "coupled" to another component, it may be connected or coupled directly to another component or may be connected or coupled to another component with the other component intervening therebetween. On the other hand, it is to be understood that when one component is referred to as being "directly connected" or "directly coupled" to another component, it may be connected or coupled to another component without any other component intervening therebetween. Other expressions describing the relationship between the components, that is, "between" and "directly between" or "adjacent to" and "directly adjacent to" should also be similarly interpreted.

The terms used in the present specification are used only to describe the specific exemplary embodiment, and are not intended to limit the present inventive concept. Singular forms are to include plural forms unless the context clearly indicates otherwise. It will be further understood that terms "comprises" or "have" used in the present specification specify the presence of stated features, numerals, steps, operations, components, parts, or a combination thereof, but do not preclude the presence or addition of one or more other features, numerals, steps, operations, components, parts, or a combination thereof.

All terms used herein including technical or scientific terms have the same meanings as meanings which are generally understood by those skilled in the technical field to which the present inventive concept pertains unless they are differently defined. Terms defined in a generally used dictionary shall be construed that they have meanings matching those in the context of a related art, and shall not be construed in ideal or excessively formal meanings unless they are clearly defined in the present specification.

Hereinafter, exemplary embodiments of the present inventive concept will be described in detail with reference to the drawings attached to the present specification.

FIG. 1 is a schematic block diagram of an organic light emitting diode (OLED) display according to an exemplary embodiment of the present inventive concept.

Referring to FIG. 1, the OLED display 10 according to the current exemplary embodiment of the present inventive concept includes a timing controller 110, a data driver 120, a scan driver 130, a control driver 140, and a pixel area 150.

The timing controller 110 may control each of operations by supplying a data driving control signal DCS to the data driver 120, a scan driving control signal SCS to the scan driver 130, and a timing driving control signal TCS to the control driver 140. In addition, the timing controller 110 may supply image data Im supplied from the outside to the data driver 120.

The data driver 120 may generate a data signal by using the image data Im received from the timing controller 110 and the data driving control signal DCS, and may supply the data signal to the data lines D1 to Dm such the data signal is synchronized with a scan signal supplied to scan lines S1 to Sn for a scan period.

The scan driver 130 may supply the scan signal to the scan lines S1 to Sn in accordance with the scan driving control signal SCS supplied from the timing controller 110. For example, the scan driver 130 may simultaneously or sequentially supply the scan signal to the scan lines S1 to Sn for one frame period in accordance with the scan driving control signal SCS.

The control driver 140 may provide a control signal to first control lines CLA1 to CLAn and second control lines CLB1 to CLBn in accordance with the timing driving control signal TCS supplied from the timing controller 110. For example, the control driver 140 may supply a first control signal to pixels Px via the first control lines CLA1 to CLAn, and may supply a second control signal to the pixels Px via the second control lines CLB1 to CLBn.

In some exemplary embodiments, the first control lines CLA1 to CLAn and the second control lines CLB1 to CLBn may be commonly connected to all the pixels Px. In this case, the control driver 140 may configure some of the first control lines CLA1 to CLAn as first control signal supply lines, and may simultaneously supply the first control signal to the first control signal supply lines.

Alternatively, the control driver 140 may configure the rest of the first control lines as first control signal sensing lines, and may feed back the first control signal supplied to the pixels to the control driver 140.

The pixel area 150 includes the pixels Px that are connected to the data lines D1 to Dm, the scan lines S1 to Sn, the first control lines CLA1 to CLAn, and the second control lines CLB1 to CLBn. Each of the pixels Px may receive a first power voltage ELVDD and a second power voltage ELVSS.

Each of the pixels Px may control an amount of current supplied to the second power voltage ELVSS from the first power voltage ELVDD via the OLED in accordance with the data signal for a light emitting period of one frame period. Accordingly, each pixel Px emits light with a predetermined luminance.

In this case, a high level of the first power voltage ELVDD represents a voltage at which a current can flow through the pixel Px, while a low level thereof represents a voltage at which no current can flow through the pixel Px. In addition, a high level of the second power voltage ELVSS represents a voltage at which no current can flow through the pixel Px, while a low level thereof represents a voltage where a current can flow through the pixel Px.

For example, the pixel Px may emit light by receiving the high-level first power voltage ELVDD and the low-level second power voltage ELVSS for the light emitting period.

Figure 2:
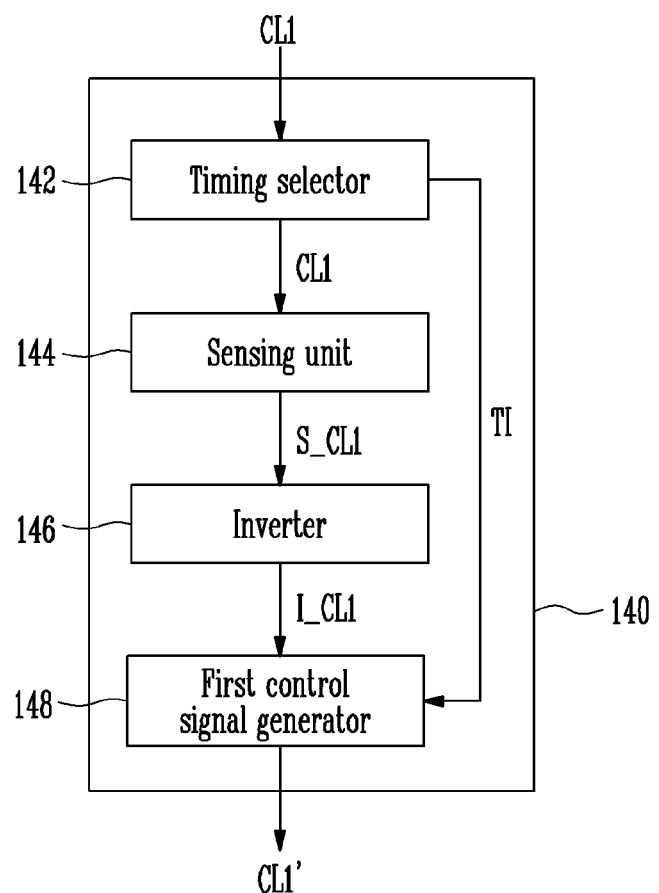
FIG. 2 is a schematic block diagram of a control driver illustrated in FIG. 1.

FIG. 2 is a schematic block diagram of the control driver illustrated in FIG. 1.

Referring to FIG. 2, the control driver 140 according to the current exemplary embodiment of the present inventive concept may include a timing selector 142, a sensing unit 144, an inverter unit 146, and a first control signal generator 148.

In order to compensate a ripple voltage generated when the first control signal CL1 is supplied to the pixel Px through the scan lines S1 to Sn, the control driver 140 may feedback the first control signal CL1 to the control driver 140.

After receiving the first control signal CL1 fed back from the pixel Px, the timing selector 142 may determine whether to generate the compensated first control signal CL1' or not.

In some exemplary embodiments, the timing selector 142 may determine that the control driver 140 gets feedback and detects the first control signal CL1 supplied to the pixel Px, except for a compensation period during which a threshold voltage of a driving transistor of each pixel Px is compensated.

For example, when the timing selector 142 determines to generate the compensated first control signal CL1', the timing selector 142 may supply the first control signal CL1 fed back from the pixel Px to the sensing unit 144.

For example, when the timing selector 142 determines not to generate the compensated first control signal CL1', the timing selector 142 may supply timing information TI to the first control signal generator 148.

The sensing unit 144 may detect the first control signal CL1 fed back from the pixels Px depending on determination of the timing selector 142. The sensing unit 144 may sense the phase and magnitude of the fed-back first control signal CL1, and may supply the sensed first control signal S_CL1 to the inverter unit 146.

In order to compensate the ripple voltage by using the sensed first control signal S_CL1, the inverter unit 146 may inversely amplify the sensed first control signal S_CL1 to generate the inverted first control signal I_CL1. In this case, the inverter unit 146 may invert the phase of the sensed first control signal S_CL1 and amplifies the inverted first control signal I_CL1 according to a predetermined ratio. A detailed operation of the inverter unit 146 will be described in detail with reference to FIGS. 5A to 5D.

The inverter unit 146 may supply the inverted first control signal I_CL1 to the first control signal generator 148.

The first control signal generator 148 may generate the compensated first control signal CL1' by using the inverted first control signal I_CL1 supplied from the inverter unit 146.

After receiving the inverted first control signal I_CL1 from the inverter unit 146, the first control signal generator 148 may generate the compensated first control signal CL1' by reflecting the inverted first control signal I_CL1 to the first control signal to be supplied to the pixel Px.

For example, the first control signal generator 148 may generate the compensated first control signal CL1' by increasing or decreasing a magnitude of the existing first control signal CL1 supplied to the pixel Px in accordance with the inverted first control signal I_CL1.

When receiving the timing information TI from the timing selector 142, the first control signal generator 148 supplies the first control signal CL1 in which an additional compensation value is not reflected to the pixels Px without generating the compensated first control signal CL1'.

Figure 3:
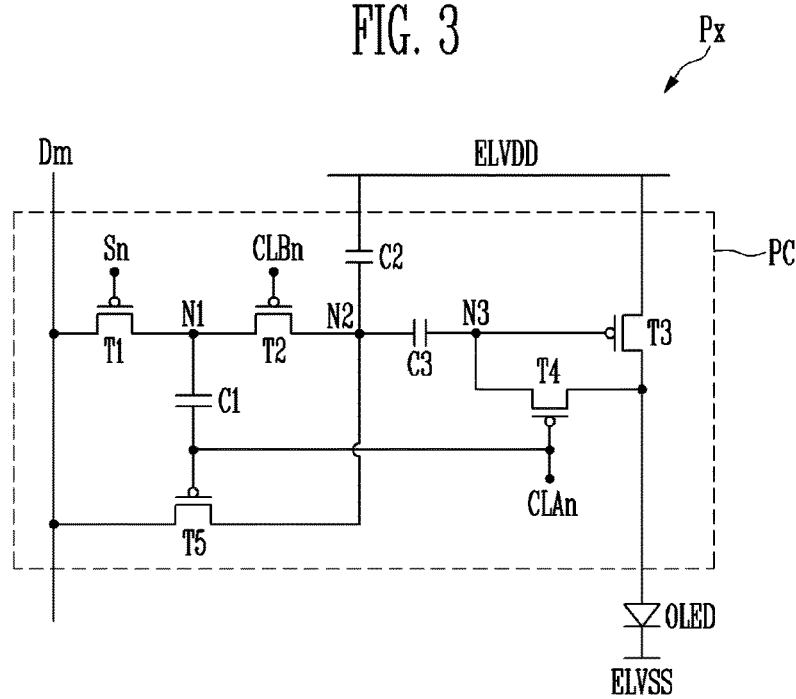
FIG. 3 is a circuit diagram of a pixel according to the exemplary embodiment of the present inventive concept.
Figure 4:
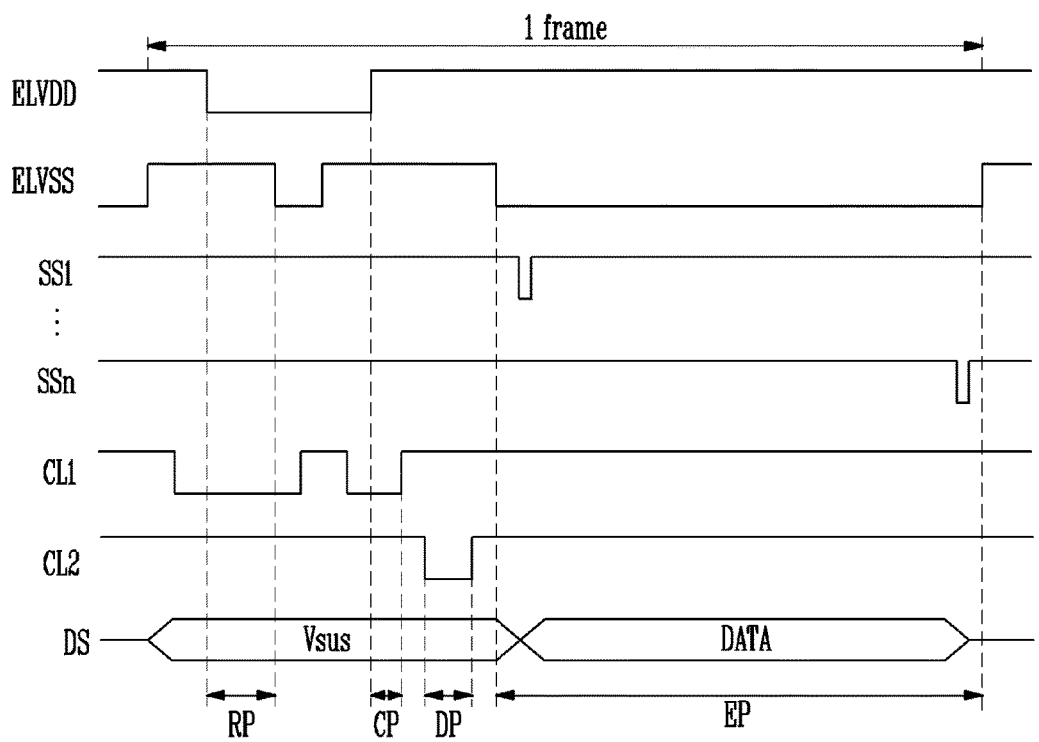
FIG. 4 illustrates a timing diagram of an operation of the pixel illustrated in FIG. 3.

FIG. 3 is a circuit diagram of a pixel according to the exemplary embodiment of the present inventive concept, and FIG. 4 illustrates a timing diagram of an operation of the pixel illustrated in FIG. 3.

Referring to FIG. 3, the pixel Px according to the current exemplary embodiment of the present inventive concept includes an OLED and a pixel circuit PC for supplying a current to the OLED.

An anode of the OLED is connected to the pixel circuit PC, while a cathode thereof is connected to the second power voltage ELVSS. The OLED may emit light with luminance corresponding to the current supplied from the pixel circuit PC.

The pixel according to the current exemplary embodiment of the present inventive concept, the pixel circuit PC may include five transistors and three capacitors.

A gate electrode of a first transistor T1 is connected to a scan line Sn, a first electrode thereof is connected to a data line Dm, and a second electrode thereof is connected to a first node N1.

A gate electrode of a second transistor T2 is connected to a second control line CLBn, a first electrode thereof is connected to the first node N1, and a second electrode thereof is connected to a second node N2.

A gate electrode of a third transistor T3 is connected to a third node N3, a first electrode thereof is connected to a first power voltage ELVDD, and a second electrode thereof is connected to the anode of the OLED.

A gate electrode of a fourth transistor T4 is connected to a first control line CLAn, a first electrode thereof is connected to the anode of the OLED, and a second electrode thereof is connected to the third node N3.

A gate electrode of a fifth transistor T5 is connected to the first control line CLAn, a first electrode thereof is connected to the data line Dm, and the second electrode thereof is connected to the second node N2.

A first capacitor is connected between the first node N1 and the first control line CLAn.

A second capacitor is connected between the first power voltage ELVDD and the second node N2.

A third capacitor is connected between the second node N2 and the third node N3.

Referring to FIG. 4, the pixel Px according to the current exemplary embodiment of the present inventive concept illustrated in FIG. 3 may be operated in a simultaneous light emitting mode, and may be differently operated by dividing one frame period into a reset period RP, a compensation period OF, a data period DP, and a emitting period EP.

During the reset period RP, the first power voltage ELVDD and a first control signal CL1, which is supplied to the first control lines CLA1 to CLAn, are applied as a low level signal, scan signals SS1 to SSn, which are supplied to the scan lines S1 to Sn, and a second control signal CL2, which is supplied to the second control lines CLB1 to CLBn, are applied as a gate-off voltage, and a data signal DS is applied as a high-level sustain voltage VSUS.

Accordingly, the fifth transistor T5 and the fourth transistor T4 are turned on, and the third transistor T3 is diode-connected. In addition, a voltage of the anode of the OLED and a voltage of the third node N3 are initialized to a level of the first power voltage ELVDD which is low level signal.

During the compensation period OF, the first control signal CL1 is applied as a low level signal, and the data signal DS is applied as the high-level sustain voltage VSUS. Accordingly, the fifth transistor T5 is turned on, and a sustain voltage VSUS is applied to the second node N2.

Accordingly, the fourth transistor T4 is turned on, and the third transistor T3 is diode-connected. After a voltage corresponding to a threshold voltage of the third transistor T3 is stored in the third capacitor C3, the fourth transistor T4 is turned off.

During the data period DP, the first power voltage ELVDD and the second power voltage ELVSS are applied as a high level voltage, and the second control signal CL2 is applied as a low level signal. Accordingly, the second transistor T2 is turned on, and a data signal DS of the previous frame stored in the first capacitor C1 is discharged to the second node N2. In addition, a voltage difference between the second power voltage ELVDD and the second node N2 is stored in the second capacitor C2.

During the emitting period EP, scanning and light emission are simultaneously performed. During the emitting period EP, the first power voltage ELVDD is applied as a high level voltage, while the second power voltage ELVSS is applied as a low level voltage. In addition, the low level scan signals SS1 to SSn are sequentially applied to each scan line and thus the first transistor T1 is turned on, and the data signal DS is sequentially input to the pixels connected to each of the scan line S1 to Sn.

Accordingly, a voltage corresponding to a data signal DS of the current frame is stored in the first capacitor C1. The second transistor T2 is turned off such that the first node N1 is cut off from the second node N2. In addition, a current path from the first power voltage ELVDD to the cathode of the OLED is created via the turn-on third transistor T3, and for the scan period of the previous frame, the OLED emits light with luminance corresponding to the data signal stored in the second capacitor C2. In this case, the pixels simultaneously emit light as a whole.

Meanwhile, during the emitting period EP, if the data signal DS is applied when the voltage corresponding to the data signal DS of the current frame is stored in the first capacitor C1, a ripple voltage may be generated in the first control signal by a RC delay or coupling.

In the OLED display 10 according to the current exemplary embodiment of the present inventive concept, the first control signal CL1 may be fed back via some of the first control lines CLA1 to CLAn so as to compensate the ripple voltage generated in the first control signal CL1.

Referring to FIG. 2, the illustrated control driver 140 may generate the compensated first control signal CL1' by using the fed-back first control signal CL1, and the control driver 140 may supply the compensated first control signal CL1' back to the pixels Px such that the voltage corresponding to a data signal DS is stably stored in the first capacitor C1 of the pixel Px.

Referring back to FIGS. 3 and 4, even if the data signal DS is applied to the pixel Px and thus the ripple voltage is generated in the first control signal CL1, a voltage difference between the compensated first control signal CL1' and the data signal DS may be stably stored in the first capacitor C1 by using the compensated first control signal CL1' supplied again from the control driver 140 during the data period DP.

The OLED display 10 according to the current exemplary embodiment of the present inventive concept may supply the compensated first control signal CL1' to each pixel during the data period DP, feedback the first control signal CL1 during at least one of the reset period RP and the data period DP, and supply the compensated first control signal CL1' to the pixel Px.

FIGS. 5A to 5D are conceptual diagrams illustrating a method for generating a compensated first control signal of an OLED display according to an exemplary embodiment of the present inventive concept.

Figure 5A:
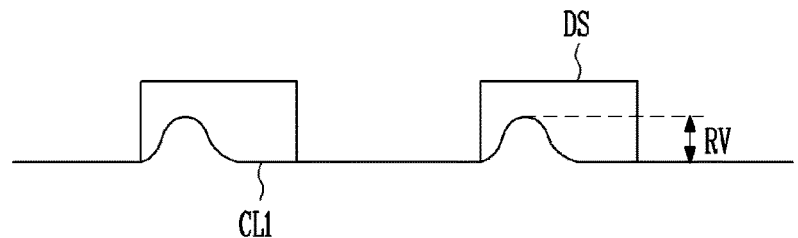
FIGS. 5A, 5B, 5C and 5D are conceptual diagrams illustrating a method for generating a compensated first control signal of an OLED display according to an exemplary embodiment of the present inventive concept.

Referring to FIG. 5A, a data signal DS and a first control signal CL1 applied to opposite ends of the first capacitor C1 during a data period DP are illustrated.

When the data signal DS is applied to a first electrode of the first capacitor C1, a ripple voltage RV may be generated in the first control signal CL1 that is applied to a second electrode of the first capacitor C1. Since the first capacitor C1 stores a voltage corresponding to difference between the data voltage DS and the first control signal CL1, a voltage of desired magnitude may not be stored when the first control signal CL1 varies due to ripple voltage RV.

Subsequently, an OLED emits light with luminance corresponding to a voltage corresponding to a difference between the voltage stored in the first capacitor C1 and a first power voltage ELVDD, it is impossible to emit light with desired luminance unless a voltage of a desired magnitude is stored in the first capacitor C1. Accordingly, luminance imbalance such as stains may occur on an image displayed by an OLED display 10.

Figure 5B:
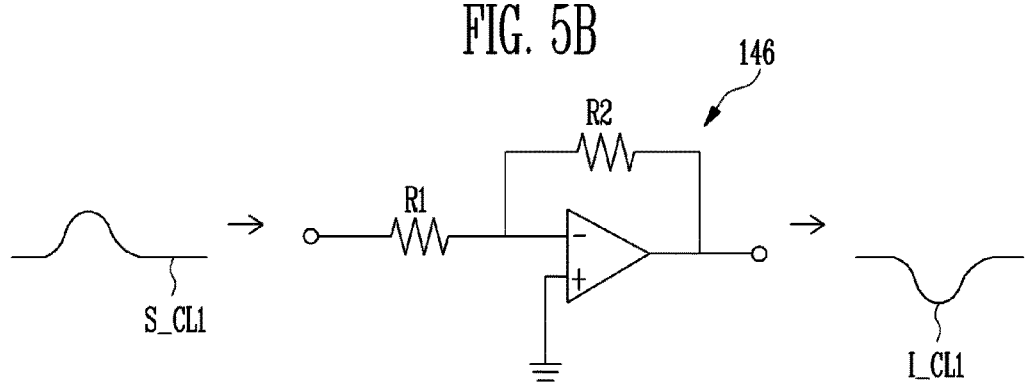

Referring to FIG. 5B, a method for generating an inverted first control signal I_CL1 by supplying the first control signal CL1 fed back from a pixel Px to an inverter unit 146 during a data period DP is shown.

A sensing unit 144 may sense the phase and magnitude of the fed-back first control signal CL1 and generate a sensed control signal S_CL1.

The sensed first control signal S_CL1 may be inverted using an inverter unit 146, and may be amplified in accordance with a predetermined ratio. For example, the inverter unit 146 may generate the inverted first control signal I_CL1 by using the sensed first control signal S_CL1 according to the following equation.

$$I\_CL1 = -(R2/R1)*S\_CL1$$

That is, the inverter unit 146 may amplify the sensed first control signal S_CL1 by inverting a phase of the sensed first control signal S_CL1 and then adjusting an amplification ratio according to resistances of the resistors R1 and R2. In this case, the amplification ratio may be adjusted whenever the sensed first control signal S_CL1 is supplied, or may be predetermined before the sensed first control signal S_CL1 is supplied.

The inverter unit 146 illustrated in FIG. 5B is merely illustrated as one example to describe a method for generating the inverted first control signal I_CL1, so the inverter unit 146 according to the current exemplary embodiment of the present inventive concept may be implemented in various ways such that the sensed first control signal S_CL1 is inversely amplified.

Figure 5C:
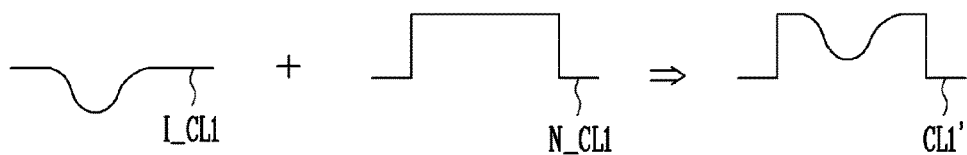

Referring to FIG. 5C, a method in which a first control signal generator 148 generates the compensated first control signal CL1' during a data period DP by using the inverted first control signal I_CL1 is illustrated.

When receiving the inverted first control signal I_CL1, the first control signal generator 148 may generate the compensated first control signal CL1' by reflecting the inverted first control signal I_CL1 to the first control signal N_CL1 to be supplied to the pixel Px.

In this case, the first control signal generator 148 may generate the compensated first control signal CL1' by increasing or decreasing a magnitude of the first control signal N_CL1 to be supplied to the pixel Px in accordance with the inverted first control signal I_CL1.

Figure 5D:
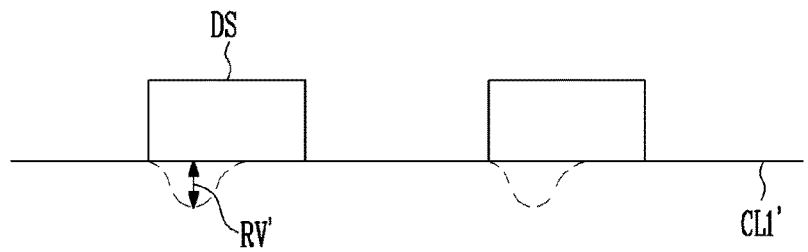

Referring to FIG. 5D, the data signal DS applied to opposite ends of the first capacitor C1 during the data period DP and the compensated first control signal CL1' are shown.

When the data signal DS is applied to a first electrode of the first capacitor C1, a ripple voltage RV' may be generated in the compensated first control signal CL1' that is applied to a second electrode of the first capacitor C1. When the ripple voltage RV' is generated in the compensated first control signal CL1', the compensated first control signal CL1' is changed to a voltage level of the first control signal that is initially desired.

Accordingly, even if the ripple voltage RV' is generated, the first capacitor C1 may stably store a voltage corresponding to the difference between the data signal DS and the compensated first control signal CL1'. Accordingly, the first capacitor C1 may store a voltage of a desired magnitude, and the OLED may emit light with desired luminance. Accordingly, using the method as described above, the OLED display 10 may uniformly display the image without luminance imbalance.

For ease of description, in FIGS. 5A to 5D, the method for compensating only the ripple voltage generated in the first control signal is described, but it is not limited thereto, and the ripple voltage generated in the first control signal for the reset period RP and the emitting period EP may also be compensated using the same method.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present inventive concept as set forth in the following claims.

What is claimed is:

1. An organic light emitting diode (OLED) display comprising:
   pixels connected to scan lines, data lines, and control lines, the control lines being connected to respective gate electrodes of transistors in the pixels;
   a data driver for supplying a data signal to the pixels via the data lines;
   a scan driver for supplying a scan signal to the pixels via the scan lines; and
   a control driver for supplying a first control signal to the pixels via the control lines, wherein the control driver feeds back the first control signal supplied to the pixels so as to compensate a ripple voltage included in the first control signal, and generates a compensated first control signal by using the fed-back first control signal,
   wherein the pixels are differently operated by dividing one frame period into a reset period, a compensation period, a data period, and an emitting period, and
   wherein the control driver includes:
      a timing selector configured to determine whether to generate the compensated first control signal or not;
      a sensing unit configured to feedback and sense the first control signal supplied to each of the pixels according to determination of the timing selector;
      an inverter unit configured to generate an inverted first control signal by inversely amplifying the sensed first control signal; and
      a first control signal generator configured to generate the compensated first control signal by reflecting the inverted first control signal to the first control signal supplied to the pixels.

2. The OLED display of claim 1, wherein the pixels respectively receive and store a first data signal corresponding to the corresponding frame for one frame period, and simultaneously emit light with luminance corresponding to a second data signal corresponding to a previous frame of the corresponding frame.

3. The OLED display of claim 1, wherein the pixel respectively store a voltage corresponding to a difference between the data signal and the first control signal, and emit light with luminance corresponding to a difference between a stored voltage and a first power supply voltage.

4. The OLED display of claim 1, wherein the control driver feeds back the first control signal supplied to each of the pixels during the data period, and generates the compensated first control signal by using the fed-back first control signal.

5. The OLED display of claim 1, wherein the control driver supplies the first control signal via some of the control lines, and feeds back the first control signal supplied to the pixels via the rest of the control lines.

6. The OLED display of claim 1, wherein the control lines are connected to each other, and the pixels simultaneously receive the first control signal from the control driver.

7. The OLED display of claim 1, wherein the timing selector determines to generate the compensated first control signal during at least one of the rest of periods other than the compensation period.

8. The OLED display of claim 1, wherein the timing selector transmits timing information to the first control signal generator when the timing selector determines not to generate the compensated first control signal, and the first control signal generator generates the first control signal according to the timing information and supplies it to each of the pixels.

9. The OLED display of claim 1, wherein the inverter unit inverts a phase of the sensed first control signal, amplifies the first control signal with a predetermined ratio, and generates the inverted first control signal.

10. The OLED display of claim 1, wherein the first control signal generator generates the compensated first control signal by increasing or decreasing a magnitude of the first control signal according to the inverted first control signal, and supplies the compensated first control signal to each of the pixels.

11. The OLED display of claim 1, wherein each of the pixels respectively include:
   a first transistor with a gate electrode connected to a first scan line of the scan lines, a first electrode connected to a first data line of the data lines, and a second electrode connected to a first node;
   a second transistor with a gate electrode connected to a second control line of the control lines for supplying a second control signal, a first electrode connected to the first node, and a second electrode connected to a second node;
   a third transistor with a gate electrode connected to a third node, a first electrode connected to a first power supply voltage, and a second electrode connected to an anode of an OLED;
   a fourth transistor with a gate electrode connected to a first control line of the control lines, a first electrode connected to the anode, and a second electrode connected to the third node;
   a fifth transistor with a gate electrode connected to the first control line of the control lines, a first electrode connected to the first data line, and a second electrode connected to the second node;
   a first capacitor connected between the first node and the first control line of the control lines;
   a second capacitor connected between the first power voltage and the second node; and
   a third capacitor connected between the second node and the third node.

12. The OLED display of claim 11, wherein the fourth transistor and the fifth transistor continue to be turned on during the reset period and the compensation period.

13. The OLED display of claim 11, wherein the second transistor continue to be turned on during the data period.

14. The OLED display of claim 11, wherein the first transistor is turned on during the emitting period to apply the data signal to the first node.

\* \* \* \* \*